(12) United States Patent
Kim

(10) Patent No.: US 8,189,416 B2
(45) Date of Patent: May 29, 2012

(54) SEMICONDUCTOR MEMORY DEVICE

(75) Inventor: Hyung-Seuk Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 211 days.

(21) Appl. No.: 12/662,575

(22) Filed: Apr. 23, 2010

(65) Prior Publication Data

US 2010/0277997 A1 Nov. 4, 2010

(30) Foreign Application Priority Data

Apr. 29, 2009 (KR) .................. 10-2009-0037746

(51) Int. Cl.
*G11C 7/02* (2006.01)
(52) U.S. Cl. .................. 365/207; 365/203; 365/189.011
(58) Field of Classification Search .................. 365/207, 365/203, 189.011
See application file for complete search history.

(56) References Cited

U.S. PATENT DOCUMENTS

| | | | |
|---|---|---|---|
| 5,295,103 A | | 3/1994 | Yamauchi |
| 6,469,941 B2 * | | 10/2002 | Ricodeau ................. 365/189.09 |
| 7,345,939 B2 | | 3/2008 | Lee et al. |
| 2007/0104003 A1 | | 5/2007 | Kang |

FOREIGN PATENT DOCUMENTS

| | | |
|---|---|---|
| JP | 5-12869 | 1/1993 |
| JP | 2006-54040 | 2/2006 |
| JP | 2007-134037 | 5/2007 |
| KR | 1995-0014248 | 11/1995 |
| KR | 10-2005-0023537 | 3/2005 |
| KR | 10-0699875 | 3/2007 |
| KR | 10-0702004 | 3/2007 |

OTHER PUBLICATIONS

Abstract of corresponding Korean Patent Publication No. 10-2006-0012216, published on Feb. 7, 2006.

* cited by examiner

*Primary Examiner* — Son Dinh
*Assistant Examiner* — Nam Nguyen
(74) *Attorney, Agent, or Firm* — Harness, Dickey & Pierce

(57) ABSTRACT

The semiconductor memory device includes a first memory cell connected between a first word line and a bit line. The semiconductor memory device may also include a second memory cell connected between a second word line and an inverted bit line. Additionally, the memory device may include a precharger configured to charge the bit line and the inverted bit line to a first voltage before a read operation, a first sense amplifier having a first transistor connected between to the bit line and a first node, the first transistor including a gate to which a signal of the inverted bit line is applied. The semiconductor memory device may have a second transistor connected between the inverted bit line and a second node, the second transistor including a gate to which a signal of the bit line is applied, and the first sense amplifier configured to amplify a voltage of the bit line or the inverted bit line to a second voltage based on to the second voltage applied to one of the first node and the second nodes during the read operation. The semiconductor memory device may also have a bias unit configured to generate a voltage difference between the first node and the second node, and a sense amplifier driver configured to apply the second voltage to one of the first and second nodes based on one of the first and second selected word lines during the read operation.

12 Claims, 6 Drawing Sheets

SEMICONDUCTOR MEMORY DEVICE

PRIORITY STATEMENT

This application claims the benefit of priority under 35 U.S.C. §119 to Korean Patent Application No. 10-2009-0037746, filed on Apr. 29, 2009, in the Korean Intellectual Property Office (KIPO), the disclosure of which are hereby incorporated by reference in its entirety.

BACKGROUND

1. Field

Example embodiments relate to a semiconductor memory device, and more particularly, to a semiconductor memory device having a sense amplifier capable of ensuring a sensing margin during a read operation.

2. Description of Related Art

Semiconductor memory devices have a plurality of memory cells, and store data in the memory cells or read data stored in the memory cells. Semiconductor memory devices use sense amplifiers to read data stored in memory cells.

When a word line is enabled during a read operation, data stored in memory cells connected with the enabled word line may be transferred to the corresponding bit line (or inverted bit line), and the voltage level of the bit line (or inverted bit line) may be changed. An inverted bit line (or bit line) disposed adjacent to the bit line (or inverted bit line) may be kept at a desired or alternatively predetermined precharge voltage level. A sense amplifier may sense and may amplify a voltage difference between the bit line (or inverted bit line) and the adjacent inverted bit line (or bit line).

SUMMARY

Example embodiments provide a semiconductor memory device having a sense amplifier capable of ensuring or protecting a sensing margin during a read operation.

Example embodiments are directed to a semiconductor memory device. The semiconductor memory device may include a first memory cell connected between a first word line and a bit line; a second memory cell connected between a second word line and an inverted bit line; a precharger configured to charge the bit line and the inverted bit line to a first voltage before a read operation. The semiconductor memory device may also include a first sense amplifier having a first transistor connected between the bit line and a first node. The first transistor may also include a gate to which a signal of the inverted bit line is applied. and the first sense amplifier may include a second transistor connected between the inverted bit line and a second node. The second transistor may include a gate to which a signal of the bit line may be applied. Also, the first sense amplifier may be configured to amplify a voltage of the bit line or the inverted bit line to a second voltage in response to the second voltage applied to the first node or the second node during the read operation. The semiconductor memory device may also include a bias unit configured to generate a desired or alternatively predetermined voltage difference between the first node and the second node. The semiconductor memory device may also include a sense amplifier driver that may be configured to apply the second voltage to the second node when the first word line is selected during the read operation, and may apply the second voltage to the first node when the second word line is selected.

In example embodiments, the semiconductor memory device may further include a second sense amplifier connected between the bit line and the inverted bit line, and may be configured to amplify a voltage of the inverted bit line or the bit line to the first voltage in response to the first voltage during the read operation.

In example embodiments, the bias unit may have a bias transistor connected between the first node and the second node and include a gate to which a bias voltage is applied.

In example embodiments, the first voltage may be a power supply voltage, the second voltage may be a ground voltage, and the bias transistor, the first transistor and the second transistor may be n-channel metal oxide semiconductor (NMOS) transistors.

In example embodiments, the first voltage may be a ground voltage, the second voltage may be a power supply voltage, and the bias transistor, the first transistor and the second transistor may be p-channel metal oxide semiconductor (PMOS) transistors.

In example embodiments, the sense amplifier driver may apply the second voltage to the second node and then the first node when the first word line is selected, and may apply the second voltage to the first node and then the second node when the second word line is selected.

In example embodiments, the semiconductor memory device may include a plurality of first sense amplifiers and a plurality of bias transistors, and each of the bias transistors may be connected between the first node and the second node of the corresponding one of the first sense amplifiers.

In example embodiments, the semiconductor memory device may further include: a sense amplifier region including a plurality of prechargers, first sense amplifiers and second sense amplifiers; and a junction region in which the sense amplifier driver is disposed. Here, the bias transistor may be disposed in the sense amplifier region or the junction region.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
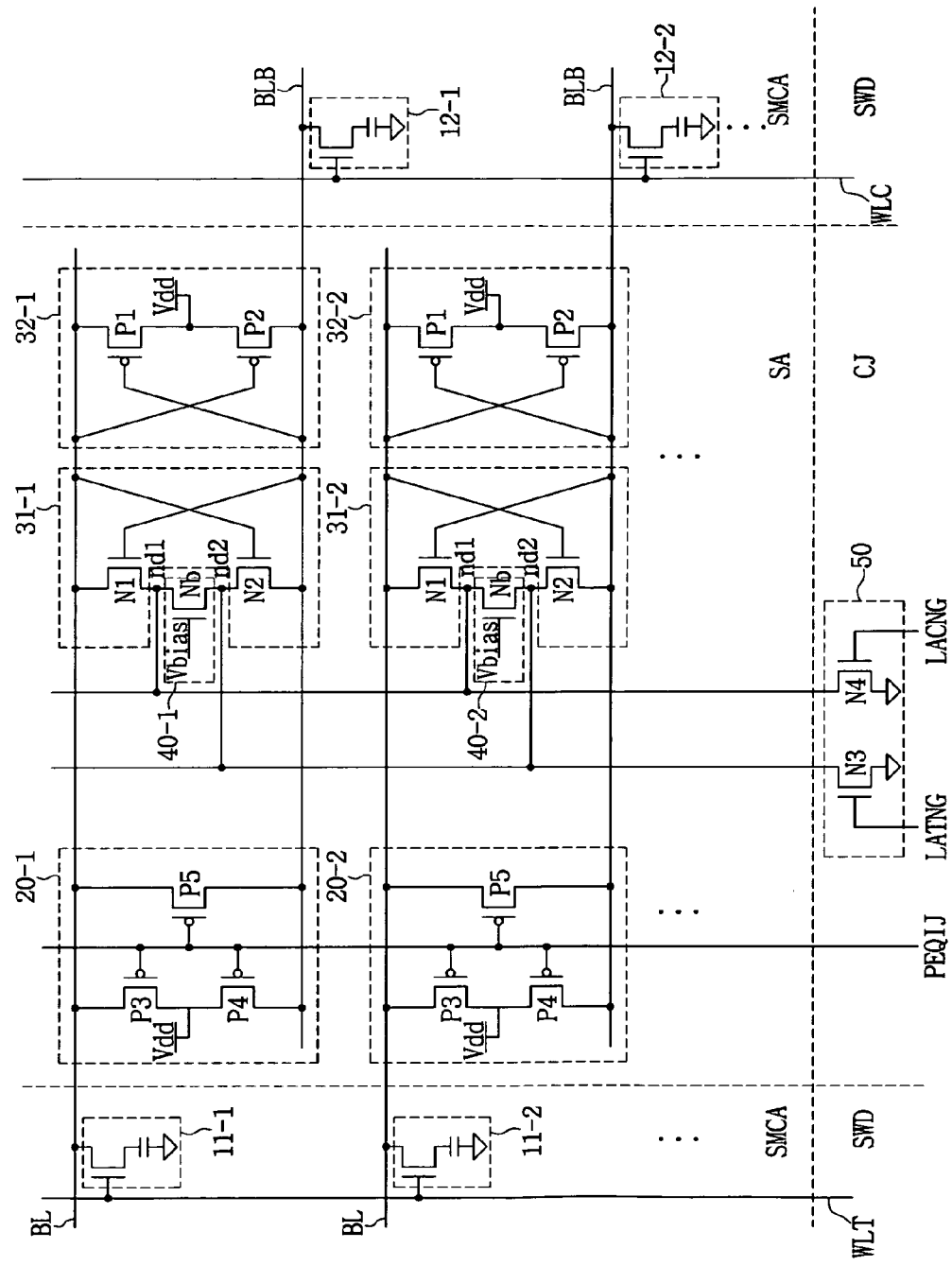
FIG. 1 shows the constitution of a semiconductor memory device according to a first example embodiment.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. Example Embodiments, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, embodiments are not limited to example embodiments described.

FIG. 1 illustrates a semiconductor memory device according to a first example embodiment. The semiconductor memory device may include first memory cells 11-1, 11-2, ..., second memory cells 12-1, 12-2, ..., bit-line prechargers 20-1, 20-2, ..., n-channel metal oxide semiconductor (NMOS) sense amplifiers 31-1, 31-2, ..., p-channel metal oxide semiconductor (PMOS) sense amplifiers 32-1, 32-2, ..., bias units 40-1, 40-2, ..., and a sense amplifier driver 50.

In FIG. 1, SMCA indicates a sub-memory cell array region, SA indicates a sense amplifier region, SWD indicates a sub-word line driver region, CJ indicates a junction region, WLT indicates a first word line, WLC indicates a second word line, BL indicates bit lines, and BLB indicates inverted bit lines.

Each of the first memory cells 11-1, 11-2, ... may be connected between the first word line WLT and a corresponding bit line BL, and each of the second memory cells 12-1, 12-2, ... may be connected between the second word line WLC and the corresponding inverted bit line BLB.

Each of the bit-line prechargers 20-1, 20-2, ... may include two PMOS transistors P3 and P4 connected between a corresponding bit line BL and a corresponding inverted bit line BLB in series. Both transistors P3 and P4 may have gates to which a bit-line precharge control signal PEQIJ may be applied. A PMOS transistor P5 may be connected between the bit line BL and the inverted bit line BLB and the bit-line precharge control signal PEQIJ may be applied to a gate of transistor P5.

Each of the NMOS sense amplifiers 31-1, 31-2, ... may include a first NMOS transistor N1 connected between a corresponding bit lines BL and a first node nd1 and the first NMOS transistor N1 may have a gate to which a signal of the corresponding inverted bit-lines BLB may be applied. Each of the NMOS sense amplifiers 31-1, 31-2, ... may have a second NMOS transistor N2 connected between the inverted bit line BLB and a second node nd2 and may have a gate to which a signal of the bit line BL is applied.

Each of the PMOS sense amplifiers 32-1, 32-2, ... may include a first PMOS transistor P1 connected between a corresponding bit line BL and a power supply voltage Vdd. The first PMOS transistor may have a gate to which a signal of the corresponding one of the inverted bit-lines BLB is applied. Each of the PMOS sense amplifiers 32-1, 32-2, ... may include a second PMOS transistor P2 connected between the power supply voltage Vdd and the inverted bit line BLB. The second PMOS transistor may have a gate to which a signal of the bit line BL is applied.

Each of the bias units 40-1, 40-2, . . . may include an NMOS transistor Nb connected between a corresponding first node nd1 and a corresponding second node nd2 and may have a gate to which a bias voltage Vbias is applied.

The sense amplifier driver 50 may include an NMOS transistor N3. The NMOS transistor N3 be connected between a ground voltage and a to a signal line connected with the second nodes nd2. NMOS transistor M3 may have a gate to which a first NMOS sense amplifier control signal LATNG is applied. The sense amplifier driver 50 may also include an NMOS transistor N4. The NMOS transistor N4 may be connected between a ground voltage and to a signal line connected with the first nodes nd1 and NMOS transistor N4 may have a gate to which a second NMOS sense amplifier control signal LACNG is applied.

Functions of the respective blocks of the semiconductor memory device according to the first example embodiment shown in FIG. 1 will be described below.

When the first word line WLT is enabled, each of the first memory cells 11-1, 11-2, . . . outputs stored data to the corresponding bit line BL or stores data transferred through the bit line BL. When the second word line WLC is enabled, each of the second memory cells 12-1, 12-2, . . . outputs stored data to the corresponding inverted bit line BLB or stores data transferred through the inverted bit line BLB.

Each of the bit-line prechargers 20-1, 20-2, . . . charges the corresponding bit line BL and the corresponding inverted bit line BLB to the level of the power supply voltage Vdd in response to the bit-line precharge control signal PEQIJ.

Each of the NMOS sense amplifiers 31-1, 31-2, . . . may sense a high-level signal of the corresponding bit line BL or the corresponding inverted bit line BLB and amplifies the voltage of the inverted bit line BLB or the bit line BL to the level of the ground voltage in response to the voltage of the corresponding first node nd1 or the second node nd2.

Each of the PMOS sense amplifiers 32-1, 32-2, . . . may sense a low-level signal of the corresponding bit line BL or the inverted bit line BLB and may amplify the voltage of the inverted bit line BLB or the bit line BL to the level of the power supply voltage Vdd.

Each of the bias units 40-1, 40-2, . . . may cause a voltage difference between the corresponding first node nd1 and the corresponding second node nd2 to have a desired or alternatively predetermined voltage level. The desired or alternatively predetermined voltage may be applied as the bias voltage Vbias to turn on the NMOS transistor Nb, and thus the voltage difference between the first node nd1 and the second node nd2 may become a voltage between the drain and source of the NMOS transistor Nb. The bias voltage Vbias may have the voltage level of the power supply voltage Vdd.

The sense amplifier driver 50 may apply the ground voltage to the second nodes nd2 in response to the first NMOS sense amplifier control signal LATNG when the first word line WLT is selected, and may apply the ground voltage to the first nodes nd1 in response to the second NMOS sense amplifier control signal LACNG when the second word line WLC is selected. When the first word line WLT is selected, the sense amplifier driver 50 may apply the ground voltage to the second nodes nd2 in response to the first NMOS sense amplifier control signal LATNG and after a desired or alternatively predetermined time, apply the ground voltage to the first nodes nd1 in response to the second NMOS sense amplifier control signal LACNG. When the second word line, WLC is selected, the sense amplifier driver 50 may apply the ground voltage to the first nodes nd1 in response to the second NMOS sense amplifier control signal LACNG, and after a desired or alternatively predetermined time, apply the ground voltage to the second nodes nd2 in response to the first NMOS sense amplifier control signal LATNG.

Figure 2:
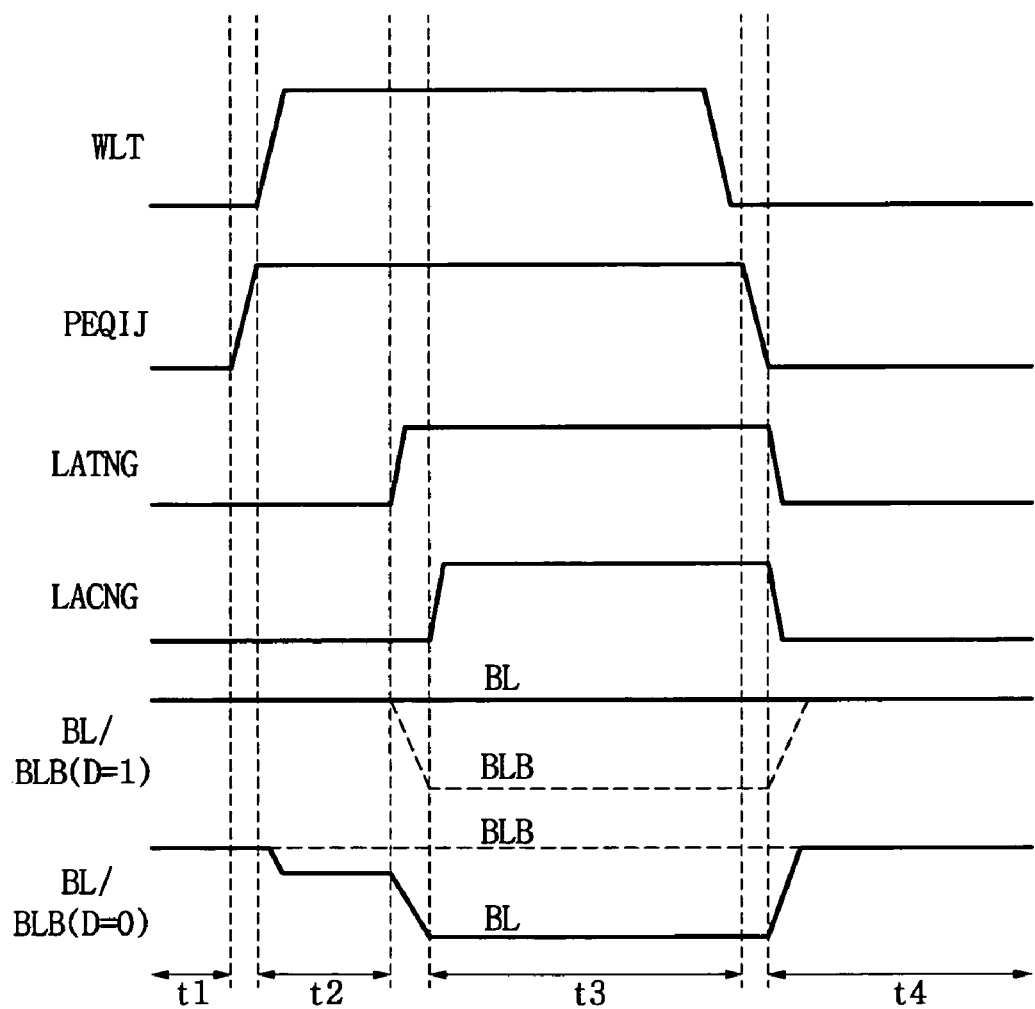
FIG. 2 is a timing diagram illustrating operation of the semiconductor memory device according to the first example embodiment shown in FIG. 1.

FIG. 2 is a timing diagram illustrating operation of the semiconductor memory device according to the first example embodiment shown in FIG. 1 when the first word line WLT is selected. In FIG. 2, WLT indicates the voltage of the first word line, PEQIJ indicates the bit-line precharge control signal, LATNG indicates the first NMOS sense amplifier control signal, and LACNG indicates the second NMOS sense amplifier control signal. Also, BL/BLB(D=1) indicates the voltages of the bit lines BL and the inverted bit lines BLB when data "1" is stored in the first memory cells 11-1, 11-2, . . . . In which a solid line indicates the voltage of the bit lines BL, and a dotted line indicates the voltage of the inverted bit lines BLB. Likewise, BL/BLB(D=0) indicates the voltages of the bit lines BL and the inverted bit lines BLB when data "0" is stored in the first memory cells 11-1, 11-2, . . . . In which a solid line indicates the voltage of the bit lines BL, and a dotted line indicates the voltage of the inverted bit lines BLB.

The read operation of the semiconductor memory device according to the first example embodiment will be described below with reference to FIGS. 1 and 2.

First, when the bit-line precharge control signal PEQIJ is enabled to a low level, the PMOS transistors of the bit-line prechargers 20-1, 20-2, . . . may be turned on, and the bit lines BL and the inverted bit lines BLB may be charged to the level of the power supply voltage Vdd. (period t1)

Subsequently, when the bit-line precharge control signal PEQIJ is disabled to a high level and the first word line WLT is selected and enabled to a high level, the first memory cells 11-1, 11-2, . . . connected with the bit lines BL may be selected. When data stored in the first memory cells 11-1, 11-2, . . . is logic "1," the bit lines BL may be kept at the charge level, that is, the level of the power supply voltage Vdd. However, when data stored in the first memory cells 11-1, 11-2, . . . is logic "0," the voltage of the bit lines BL is reduced by charge sharing. The inverted bit lines BLB are kept at the charge level, that is, the voltage level of the power supply voltage Vdd. (period t2)

Subsequently, when the first NMOS sense amplifier control signal LATNG is enabled to a high level, the sense amplifier driver 50 may apply the ground voltage to the second nodes nd2. At this time, the first nodes nd1 may have a higher voltage level than the second nodes nd2 by the voltage between the drain and source of the NMOS transistors Nb of the bias units 40-1, 40-2, . . . .

When data stored in the first memory cells 11-1, 11-2, . . . is "1," the bit lines BL and the inverted bit lines BLB may have the voltage of the power supply voltage Vdd. However, since the first nodes nd1 have a higher voltage than the second nodes nd2, the first NMOS transistors N1 of the NMOS sense amplifiers 31-1, 31-2, . . . may not be turned on, and only the second NMOS transistors N2 may be turned on. Thus, the inverted bit lines BLB have the voltage level of the ground voltage. As a result, the first PMOS transistors P1 of the PMOS sense amplifiers 32-1, 32-2, . . . are turned on, and the bit lines BL are kept at the voltage level of the power supply voltage Vdd.

When data stored in the first memory cells 11-1, 11-2, . . . is "0," the voltage of the bit lines BL may be reduced. Thus, the second PMOS transistors P2 of the PMOS sense amplifiers 32-1, 32-2, . . . may be turned on, and the inverted bit lines BLB are kept at the voltage of the power supply voltage Vdd. Since the voltage of the bit lines BL may be reduced and the voltage of the inverted bit lines BLB is kept at the level of the power supply voltage Vdd, the first NMOS sense amplifier control signal LATNG may be enabled, and the ground voltage may be applied to the second nodes nd2. Then, the first NMOS transistors N1 of the NMOS sense amplifiers 31-1, 31-2, ... may be turned on, and the voltage of the bit lines BL may be reduced to the level of the ground voltage. (period t3)

Subsequently, when the first word line WLT and the first NMOS sense amplifier control signal LATNG are disabled to a low level and the bit-line precharge control signal PEQIJ may be enabled to a low level, the bit lines BL and the inverted bit lines BLB are charged to the voltage of the power supply voltage Vdd. (period t4)

As shown in FIG. 2, in period t3, the first NMOS sense amplifier control signal LATNG is enabled, and after a desired or alternatively predetermined time, the second NMOS sense amplifier control signal LACNG may be enabled to a high level so that the ground voltage may be applied to the first nodes nd1. In this case, the operating speed of the sense amplifiers may be improved.

Although not shown in the drawing, when the second word line WLC is selected, the sense amplifier driver 50 may apply the ground voltage to the first nodes nd1. Also, when the second word line WLC is selected, the sense amplifier driver 50 may apply the ground voltage to the first nodes nd1, and after a desired or alternatively predetermined time, apply the ground voltage to the second nodes nd2, similar to the above description.

Figure 3:
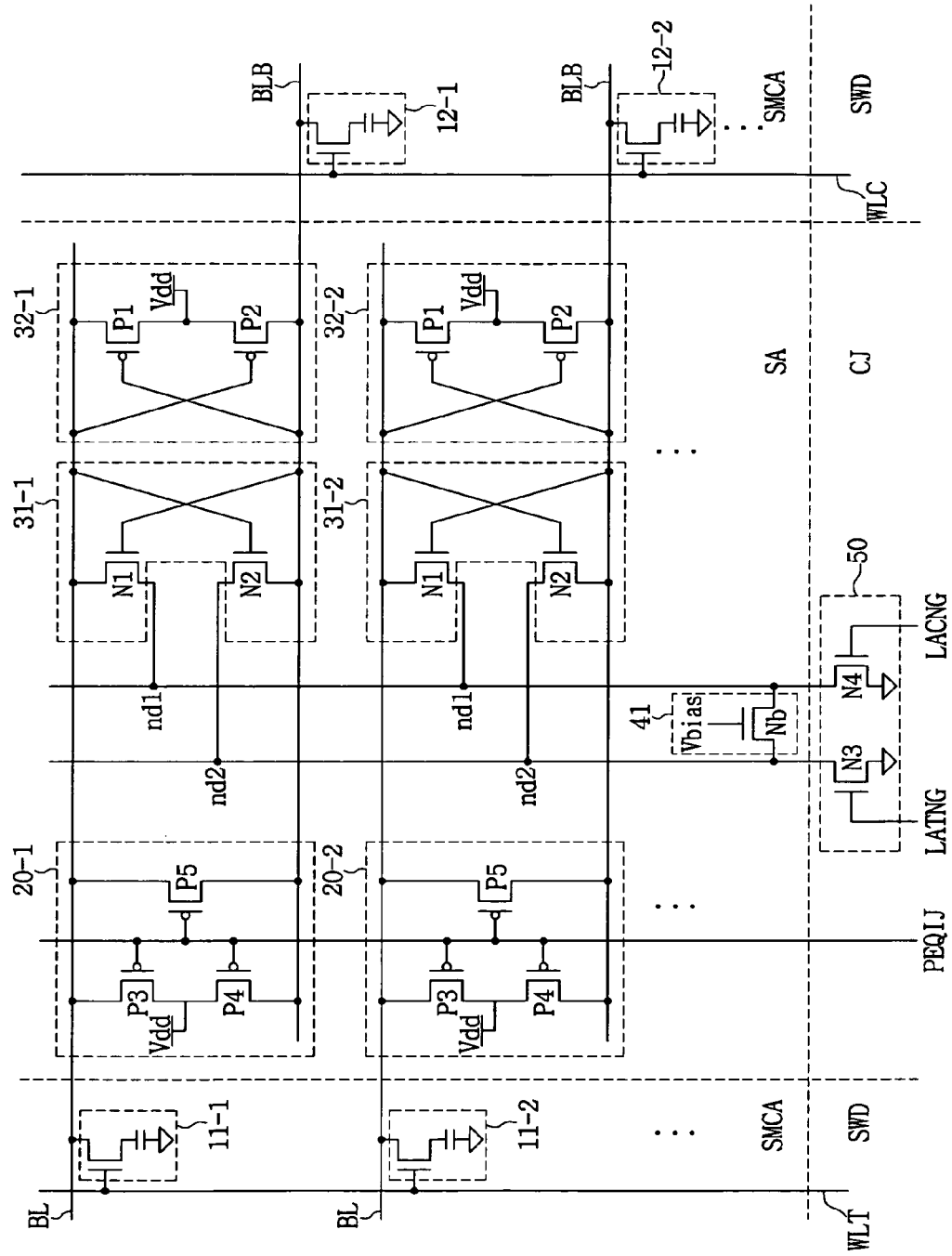
FIG. 3 shows the constitution of a semiconductor memory device according to a second example embodiment.

FIG. 3 shows the constitution of a semiconductor memory device according to a second example embodiment. The semiconductor memory device may include first memory cells 11-1, 11-2, ..., second memory cells 12-1, 12-2, ..., bit-line prechargers 20-1, 20-2, ..., NMOS sense amplifiers 31-1, 31-2, ..., PMOS sense amplifiers 32-1, 32-2, ..., a bias unit 41, and a sense amplifier driver 50.

Functions of the respective blocks shown in FIG. 3 may be similar to those described with reference in FIG. 1.

However, in the semiconductor memory device of FIG. 3, the bias unit 41 may be connected between a signal line connected with the first nodes nd1 and a signal line connected with the second nodes nd2 and may be placed or disposed in the sense amplifier region SA. Thus, the layout area of the sense amplifier region SA may be reduced.

Figure 4:
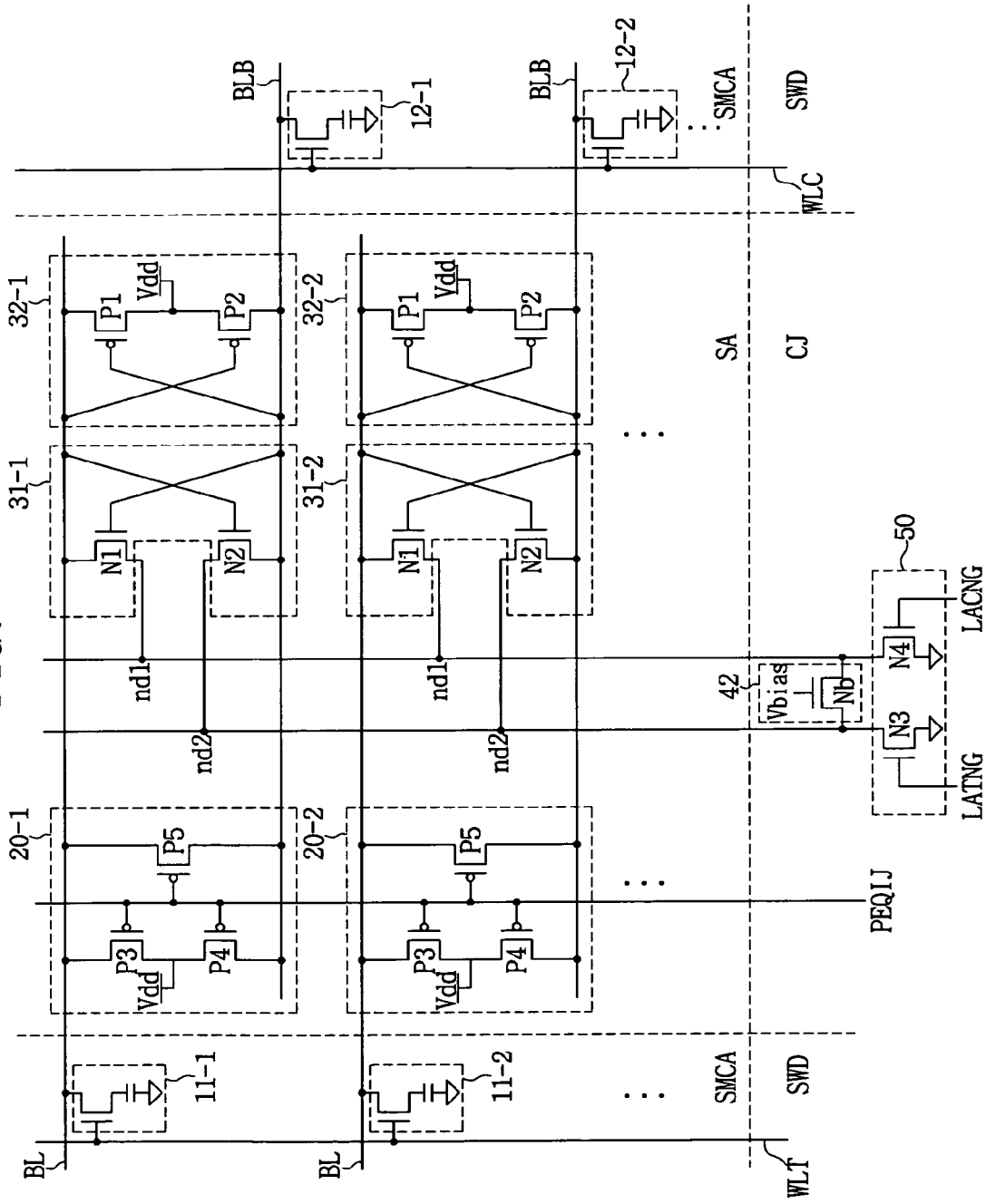
FIG. 4 shows the constitution of a semiconductor memory device according to a third example embodiment.

FIG. 4 shows the constitution of a semiconductor memory device according to a third example embodiment. The semiconductor memory device may include first memory cells 11-1, 11-2, ..., second memory cells 12-1, 12-2, ..., bit-line prechargers 20-1, 20-2, ..., NMOS sense amplifiers 31-1, 31-2, ..., PMOS sense amplifiers 32-1, 32-2, ..., a bias unit 42, and a sense amplifier driver 50.

Functions of the respective blocks shown in FIG. 4 may be similar to those described with reference in FIG. 1.

However, in the semiconductor memory device of FIG. 4, the bias unit 42 may be connected between a signal line connected with the first nodes nd1 and a signal line connected with the second nodes nd2 and may be placed or disposed in the junction region CJ. Thus, the layout area of the sense amplifier region SA may be further reduced.

Also, the semiconductor memory devices according to the second and third example embodiments shown in FIGS. 3 and 4 may be configured to operate in a similar way as described with reference to FIG. 2.

The semiconductor memory devices according to the first to third example embodiments have bias units. Thus, when the first word line WLT is selected during the read operation, the voltage of the first nodes nd1 may become higher than that of the second nodes nd2 to reduce the likelihood or alternatively prevent the first NMOS transistors N1 from being incorrectly turned on upon reading data "1." When the second word line WLC is selected, the voltage of the second nodes nd2 may become higher than that of the first nodes nd1 to reduce the likelihood or alternatively prevent the second NMOS transistors N2 from being incorrectly turned on upon reading data "1."

Figure 5:
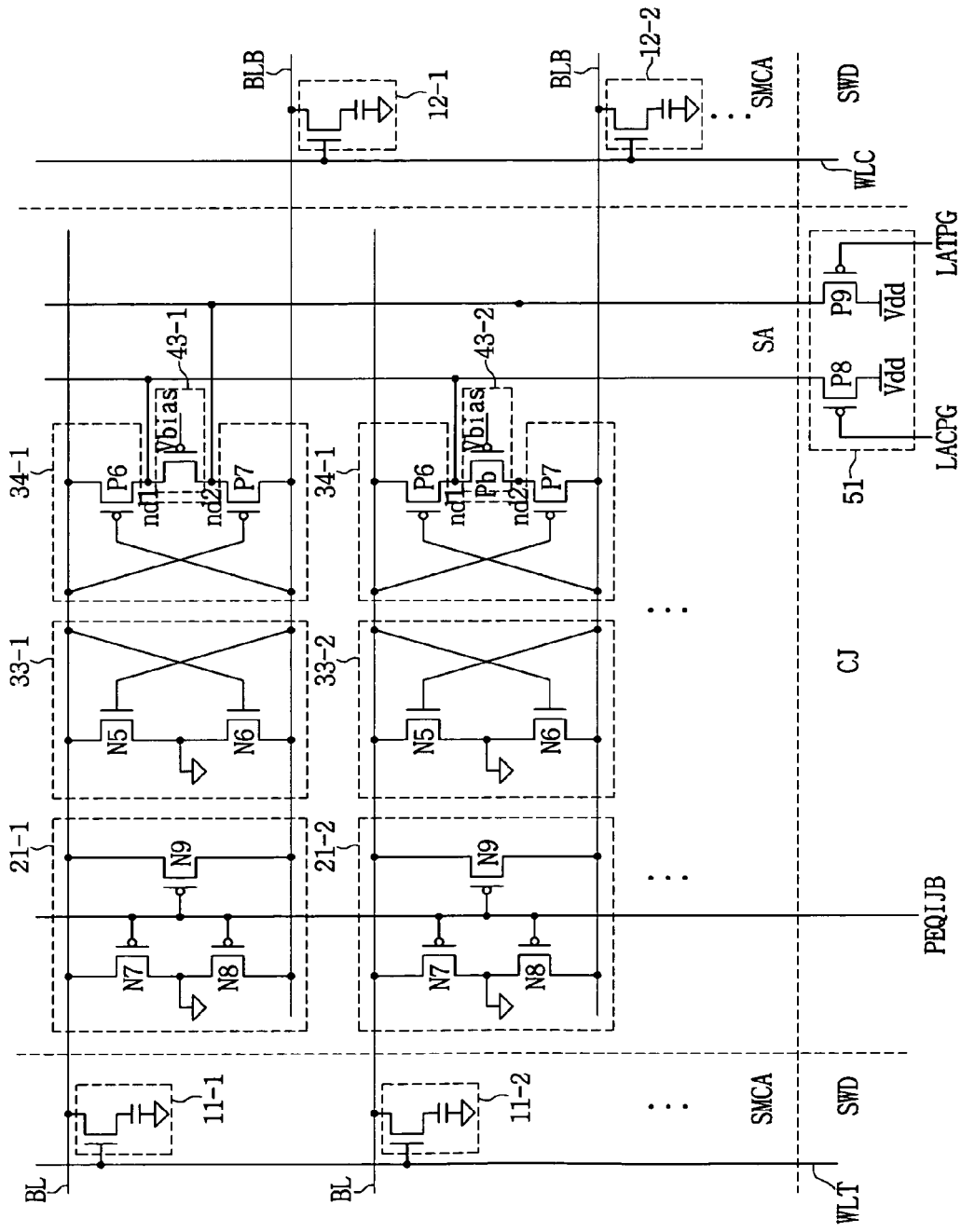
FIG. 5 shows the constitution of a semiconductor memory device according to a fourth example embodiment.

FIG. 5 shows the constitution of a semiconductor memory device according to a fourth example embodiment. The semiconductor memory device may include first memory cells 11-1, 11-2, ..., second memory cells 12-1, 12-2, ..., bit-line prechargers 21-1, 21-2, ..., NMOS sense amplifiers 33-1, 33-2, ..., PMOS sense amplifiers 34-1, 34-2, ..., bias units 43-1, 43-2, ..., and a sense amplifier driver 51.

In FIG. 5, SMCA indicates a sub-memory cell array region, SA indicates a sense amplifier region, SWD indicates a sub-word line driver region, CJ indicates a junction region, WLT indicates a first word line, WLC indicates a second word line, BL indicates bit lines, and BLB indicates inverted bit lines.

Each of the first memory cells 114, 11-2, ... may be connected between the first word line WLT and a corresponding bit line BL. Each of the second memory cells 12-1, 12-2, ... is connected between the second word line WLC and the corresponding inverted bit line BLB.

Each of the bit-line prechargers 21-1, 21-2, ... may include two NMOS transistors N7 and N8 connected between corresponding bit line BL and a corresponding inverted bit line BLB in series and having gates to which an inverted bit-line precharge control signal PEQIJB may be applied. Each of the bit-line prechargers 21-1, 21-2, ... may include an NMOS transistor N9 connected between the bit line BL and the inverted bit line BLB and having a gate to which the inverted bit-line precharge control signal PEQIJB may be applied.

Each of the NMOS sense amplifiers 33-1, 33-2, ... may include a first NMOS transistor N5 connected between a corresponding bit line BL and a ground voltage and the first NMOS transistor N5 may have a gate to which a signal of a corresponding inverted bit-line BLB may be applied. Each of the NMOS sense amplifiers 33-1, 33-2, ... may include a second NMOS transistor N6 connected between the inverted bit line BLB and the ground voltage and may a gate to which a signal of the bit line BL may be applied.

Each of the PMOS sense amplifiers 34-1, 34-2, ... may include a first PMOS transistor P1 connected between a corresponding bit line BL and a first node nd1 and may have a gate to which a signal of the corresponding inverted bit-lines BLB may be applied. Each of the PMOS sense amplifiers 34-1, 34-2, ... may include a second PMOS transistor P2 connected between a second node nd2 and the inverted bit line BLB and may have having a gate to which a signal of the bit line BL may be applied.

Each of the bias units 43-1, 43-2, ... may include a PMOS transistor Pb connected to or between the corresponding one of the first nodes nd1 and the corresponding second node nd2 and may have a gate to which a bias voltage Vbias may be applied.

The sense amplifier driver 51 may include a PMOS transistor P8 connected between a power supply voltage Vdd and a signal line connected with the first nodes nd1 and may have a gate to which a second PMOS sense amplifier control signal LACPG may be applied. The sense amplifier driver 51 may also include a PMOS transistor P9 connected between the power supply voltage Vdd and a signal line connected with the second nodes nd2 and may have a gate to which a first PMOS sense amplifier control signal LATPG may be applied.

Functions of the respective blocks of the semiconductor memory device according to the fourth example embodiment shown in FIG. 5 will be described below.

Functions of the first memory cells 11-1, 11-2, . . . and the second memory cells 12-1, 12-2, . . . are similar to those described with reference to FIG. 1.

Each of the bit-line prechargers 21-1, 21-2, . . . may charges a corresponding bit line BL and a corresponding inverted bit line BLB to the voltage level of the ground voltage in response to the inverted bit-line precharge control signal PEQIJB.

Each of the NMOS sense amplifiers 33-1, 33-2, . . . may sense a high-level signal of a corresponding bit line BL or the corresponding inverted bit line BLB and may amplify the voltage of the inverted bit line BLB or the bit line BL to the voltage level of the ground voltage.

Each of the PMOS sense amplifiers 34-1, 34-2, . . . may sense a low-level signal of a corresponding bit line BL or the corresponding inverted bit line BLB and may amplify the voltage of the inverted bit line BLB or the bit line BL to the voltage level of the power supply voltage Vdd.

Each of the bias units 43-1, 43-2, . . . may cause a voltage difference between the corresponding first node nd1 and the corresponding second node nd2 to have a desired or alternatively a predetermined voltage level. The desired or alternative predetermined voltage may be applied as the bias voltage Vbias to turn on the PMOS transistor Pb, and thus the voltage difference between the first node nd1 and the second node nd2 becomes a voltage between the drain and source of the PMOS transistor Pb. The bias voltage Vbias may have the voltage level of the ground voltage.

The sense amplifier driver 51 may apply the power supply voltage Vdd to the second nodes nd2 in response to the first PMOS sense amplifier control signal LATPG when the first word line WLT is selected, and applies the power supply voltage Vdd to the first nodes nd1 in response to the second PMOS sense amplifier control signal LACPG when the second word line WLC is selected. When the first word line WLT is selected, the sense amplifier driver 51 may apply the power supply voltage Vdd to the second nodes nd2 in response to the first PMOS sense amplifier control signal LATPG, and after a desired or predetermined time, apply the power supply voltage Vdd to the first nodes nd1 in response to the second PMOS sense amplifier control signal LACPG. When the second word line WLC is selected, the sense amplifier driver 51 may apply the power supply voltage Vdd to the first nodes nd1 in response to the second PMOS sense amplifier control signal LACPG and after a desired or predetermined time, apply the power supply voltage Vdd to the second nodes nd2 in response to the first PMOS sense amplifier control signal LATPG.

Figure 6:
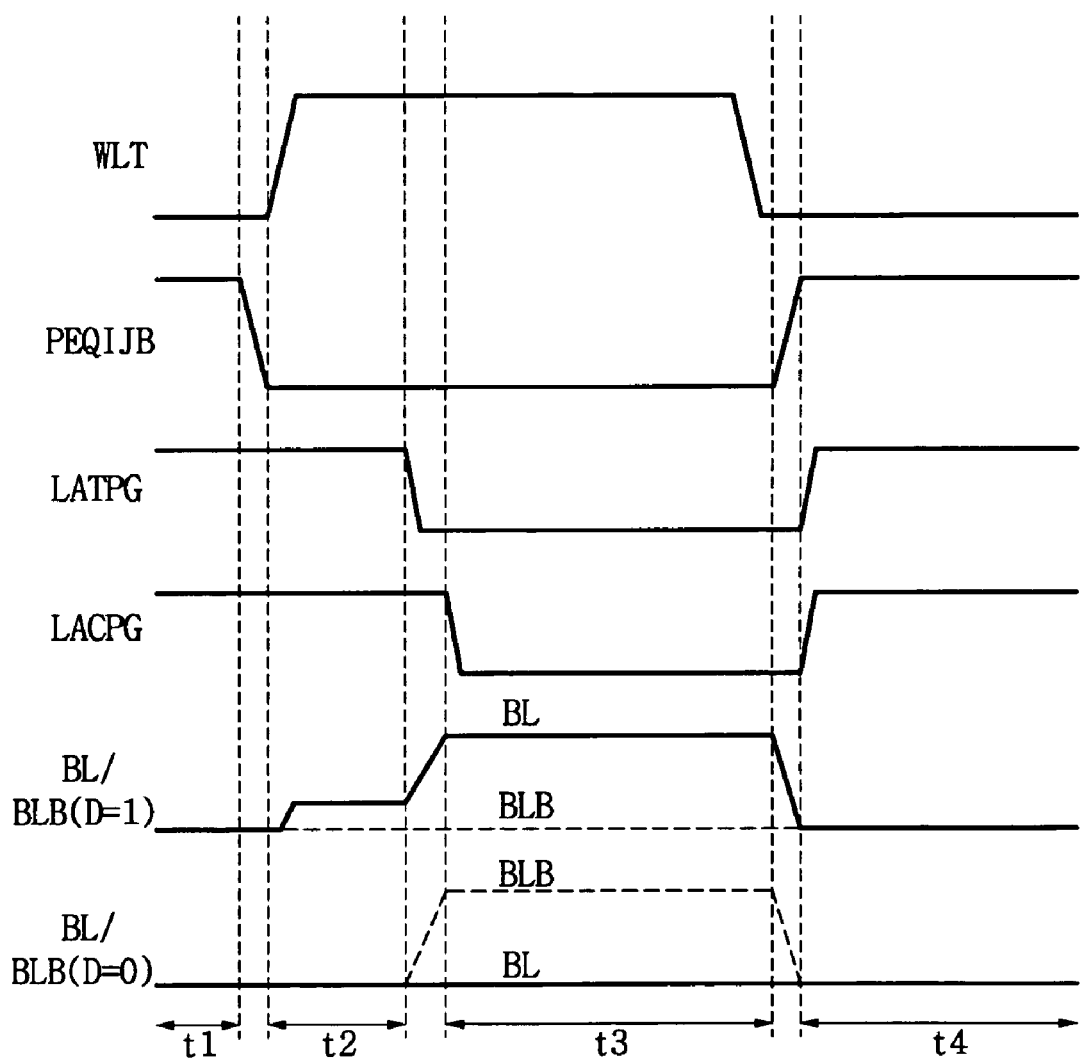
FIG. 6 is a timing diagram illustrating operation of the semiconductor memory device shown in FIG. 5.

FIG. 6 is a timing diagram illustrating operation of the semiconductor memory device according to the fourth example embodiment shown in FIG. 5 when the first word line WLT is selected. In FIG. 6, WLT indicates the voltage of the first word line, PEQIJB indicates the inverted bit-line precharge control signal, LATPG indicates the first PMOS sense amplifier control signal, and LACPG indicates the second PMOS sense amplifier control signal. Also, BL/BLB (D=1) indicates the voltages of the bit lines BL and the inverted bit lines BLB when data "1" is stored in the first memory cells 11-1, 11-2, . . . , . In which a solid line indicates the voltage of the bit lines BL, and a dotted line indicates the voltage of the inverted bit lines BLB. Likewise, BL/BLB (D=0) indicates the voltages of the bit lines BL and the inverted bit lines BLB when data "0" is stored in the first memory cells 11-1, 11-2, . . . , . In which a solid line indicates the voltage of the bit lines BL, and a dotted line indicates the voltage of the inverted bit lines BLB.

The read operation of the semiconductor memory device according to the fourth example embodiment will be described below with reference to FIGS. 5 and 6.

When the inverted bit-line precharge control signal PEQIJB is enabled to a low level, the NMOS transistors of the bit-line prechargers 21-1, 21-2, . . . are turned on, and the bit lines BL and the inverted bit lines BLB are charged to the voltage level of the ground voltage (period t1).

When the inverted bit-line precharge control signal PEQIJB is disabled to a high level and the first word line WLT is selected and enabled to a high level, the first memory cells 11-1, 11-2, . . . connected with the bit lines BL are selected. When data stored in the first memory cells 11-1, 11-2, . . . is logic "0," the bit lines BL are kept at the precharge level, that is, the voltage level of the ground voltage. However, when data stored in the first memory cells 11-1, 11-2, . . . is logic "1," the voltage of the bit lines BL increases by charge sharing. The inverted bit lines BLB are kept at the precharge level, that is, the voltage level of the ground voltage (period t2).

Subsequently, when the first PMOS sense amplifier control signal LATPG is enabled to a low level, the sense amplifier driver 51 may apply the power supply voltage Vdd to the second nodes nd2. At this time, the first nodes nd1 may have a lower voltage level than the second nodes nd2 by the voltage between the drain and source of the PMOS transistors Pb of the bias units 43-1, 43-2, . . . .

When data stored in the first memory cells 11-1, 11-2, . . . is "0," the bit lines BL and the inverted bit lines BLB may all have the voltage level of the ground voltage. However, since the first nodes nd1 may have a lower voltage than the second nodes nd2, the first PMOS transistors P6 of the PMOS sense amplifiers 34-1, 34-2, . . . may not be turned on, and only the second PMOS transistors P7 are turned on. Thus, the inverted bit lines BLB may have the voltage level of the power supply voltage Vdd. As a result, the first NMOS transistors N5 of the NMOS sense amplifiers 33-1, 33-2, . . . may be turned on, and the bit lines BL are kept at the voltage level of the ground voltage.

When data stored in the first memory cells 11-1, 11-2, . . . is "1," the voltage of the bit lines BL increases. Thus, the second NMOS transistors N6 of the NMOS sense amplifiers 33-1, 33-2, . . . may be turned on, and the inverted bit lines BLB are kept at the level of the ground voltage. Since the voltage of the bit lines BL increases and the voltage of the inverted bit lines BLB is kept at the level of the ground voltage, the first PMOS sense amplifier control signal LATPG is enabled, and the power supply voltage Vdd is applied to the second nodes nd2. Then, the first PMOS transistors P6 of the PMOS sense amplifiers 34-1, 34-2, . . . may be turned on, and the voltage of the bit lines BL increases to the level of the power supply voltage Vdd (period t3).

Subsequently, when the first word line WLT and the first PMOS sense amplifier control signal LATPG are disabled to a low level and the inverted bit-line precharge control signal PEQIJB is enabled to a high level, the bit lines BL and the inverted bit lines BLB are charged to the voltage level of the ground voltage (period t4).

As shown in FIG. 6, in period t3, the first PMOS sense amplifier control signal LATPG is enabled, and after a desired or predetermined time, the second PMOS sense amplifier control signal LACPG is enabled to a low level so that the power supply voltage Vdd may be applied to the first nodes nd1. In this case, the operating speed of the sense amplifiers may be improved.

Although not shown in the drawing, when the second word line WLC is selected, the sense amplifier driver 51 applies the power supply voltage Vdd to the first nodes nd1. Also, when the second word line WLC is selected, the sense amplifier driver 51 may apply the power supply voltage Vdd to the first nodes nd1, and after a desired or predetermined time, apply the power supply voltage Vdd to the second nodes nd2, similar to the above description.

The semiconductor memory device according to the fourth example embodiment has the bias units 43-1, 43-2, . . . . Thus, when the first word line WLT is selected during the read operation, the voltage of the first nodes nd1 may become lower than that of the second nodes nd2 to reduce the likelihood or prevent the first PMOS transistors P6 from being incorrectly turned on upon reading data "0." When the second word line WLC is selected, the voltage of the second nodes nd2 becomes lower than that of the first nodes nd1 to reduce the likelihood or prevent the second PMOS transistors P7 from being incorrectly turned on upon reading data "0."

Although not shown in the drawing, the PMOS transistor Pb of the bias units 43-1, 43-2, . . . may be placed or disposed in the sense amplifier region SA or the junction region CJ, similar to the description of FIG. 3 or 4.

Open bit-line structures are described above, but the example embodiments may also be applied to a semiconductor memory device having a folded bit-line structure.

As described above, a semiconductor memory device according to example embodiments may ensure a sufficient sensing margin while reducing the likelihood or preventing a problem caused by process variation and an increase in layout area.

The foregoing is illustrative of example embodiments and is not to be construed as limiting thereof Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
 a first memory cell connected between a first word line and a bit line;
 a second memory cell connected between a second word line and an inverted bit line;
 a precharger configured to charge the bit line and the inverted bit line to a first voltage before a read operation;
 a first sense amplifier including a first transistor connected between the bit line and a first node, the first transistor including a gate to which a signal of the inverted bit line is applied, and the first sense amplifier including a second transistor connected between the inverted bit line and a second node, the second transistor including a gate to which a signal of the bit line is applied, and the first sense amplifier configured to amplify a voltage of one of the bit line and the inverted bit line to a second voltage based on the second voltage applied to one of the first node and the second node during the read operation;
 a bias unit configured to generate a voltage difference between the first node and the second node; and
 a sense amplifier driver configured to apply the second voltage to one of the first and second nodes based on the selected one of the first and second word lines during the read operation.

2. The semiconductor memory device according to claim 1, wherein the sense amplifier driver is configured to apply the second voltage to the second node if the first word line is selected during the read operation, and apply the second voltage to the first node if the second word line is selected.

3. The semiconductor memory device according to claim 1, wherein the sense amplifier driver applies the second voltage to the second node and then the first node if the first word line is selected, and applies the second voltage to the first node and then the second node if the second word line is selected.

4. The semiconductor memory device according to claim 1, further comprising:
 a second sense amplifier connected between the bit line and the inverted bit line, and configured to amplify a voltage of one of the inverted bit line and the bit line to the first voltage in response to the first voltage during the read operation.

5. The semiconductor memory device according to claim 1, wherein the bias unit includes a bias transistor connected between the first node and the second node and including a gate to which a bias voltage is applied.

6. The semiconductor memory device according to claim 5, wherein the first voltage is a power supply voltage, the second voltage is a ground voltage.

7. The semiconductor memory device according to claim 6, wherein the bias transistor, the first transistor and the second transistor are n-channel metal oxide semiconductor (NMOS) transistors.

8. The semiconductor memory device according to claim 5, wherein the first voltage is a ground voltage, the second voltage is a power supply voltage.

9. The semiconductor memory device according to claim 8, wherein the bias transistor, the first transistor and the second transistor are p-channel metal oxide semiconductor (PMOS) transistors.

10. The semiconductor memory device according to claim 5, wherein there are a plurality of first sense amplifiers and bias transistors, and each of the bias transistors is connected between the first node and the second node of a corresponding one of the first sense amplifiers.

11. The semiconductor memory device according to claim 5, further comprising:
 a sense amplifier region including a plurality of prechargers, first sense amplifiers and second sense amplifiers; and
 a junction region in which the sense amplifier driver is disposed,
 wherein the bias transistor is disposed in the sense amplifier region.

12. The semiconductor memory device according to claim 5, further comprising:
 a sense amplifier region including a plurality of prechargers, first sense amplifiers and second sense amplifiers; and
 a junction region in which the sense amplifier driver is disposed,
 wherein the bias transistor is disposed in the junction region.

* * * * *